United States Patent
Deng (10) Patent No.: US 12,362,091 B2
(45) Date of Patent: *Jul. 15, 2025

(54) INDUCTOR DEVICE AND CONTROL METHOD THEREOF

(71) Applicant: Realtek Semiconductor Corporation, Hsinchu (TW)

(72) Inventor: Ping-Yuan Deng, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/489,867

(22) Filed: Oct. 19, 2023

(65) Prior Publication Data

US 2024/0047123 A1  Feb. 8, 2024

Related U.S. Application Data

(62) Division of application No. 16/704,030, filed on Dec. 5, 2019, now Pat. No. 11,830,661.

(30) Foreign Application Priority Data

Dec. 21, 2018  (TW) .................................. 107146550

(51) Int. Cl.
*H01F 27/29* (2006.01)
*H03B 5/12* (2006.01)
(Continued)

(52) U.S. Cl.
CPC .............. *H01F 27/29* (2013.01); *H03B 5/12* (2013.01); *H04B 1/0475* (2013.01); *H04B 15/02* (2013.01)

(58) Field of Classification Search
CPC ............. H01F 27/29; H01F 2017/0073; H01F 17/0006; H03B 5/12; H04B 1/0475; H04B 15/02

See application file for complete search history.

(56) References Cited

U.S. PATENT DOCUMENTS 8,044,734 B2  10/2011  Lane
8,159,044 B1   4/2012  Chen et al.
(Continued)

FOREIGN PATENT DOCUMENTS

CN    102543943 A   7/2012
CN    104756272 A   7/2015
(Continued)

OTHER PUBLICATIONS

Sam Chun-Geik Tan et al., "An Ultra-Low-Cost High-Performance Bluetooth SoC in 0.11-μm CMOS", IEEE Journal of Solid-State Circuits, vol. 47, No. 11, Nov. 2012.

(Continued)

*Primary Examiner* — Jeffrey M Shin
(74) *Attorney, Agent, or Firm* — CKC & Partners Co., LLC (57) ABSTRACT

An inductor device includes an 8-shaped inductor and a ring-type wire. The ring-type wire is disposed around an outer side of the 8-shaped inductor. The 8-shaped inductor includes an input terminal and a center-tapped terminal. The input terminal of the 8-shaped inductor is located on a first side of the inductor device, and the center-tapped terminal is located on a second side of the inductor device. The ring-type wire includes an input terminal and a ground terminal. The input terminal of the ring-type wire is located on the first side of the inductor device, and the ground terminal is located on the second side of the inductor device. The input terminal of the ring-type wire is coupled to the input terminal of the 8-shaped inductor.

10 Claims, 6 Drawing Sheets

(51) Int. Cl.
*H04B 1/04* (2006.01)
*H04B 15/02* (2006.01)

(56) References Cited

U.S. PATENT DOCUMENTS

| | | | |
|---|---|---|---|
| 9,478,344 | B2 | 10/2016 | Liu et al. |
| 9,646,762 | B2 | 5/2017 | Vilander |
| 11,830,661 | B2 * | 11/2023 | Deng ................. H03B 5/12 |
| 2009/0096566 | A1 | 4/2009 | Lee |
| 2010/0283665 | A1 | 11/2010 | Bashir et al. |
| 2011/0156854 | A1 | 6/2011 | Lee |
| 2012/0244802 | A1 | 9/2012 | Feng |
| 2013/0285198 | A1 | 10/2013 | Kihara |
| 2015/0170816 | A1 | 6/2015 | Liu et al. |
| 2015/0364242 | A1 * | 12/2015 | Aboush ............... H03B 5/1212 336/192 |
| 2015/0381135 | A1 | 12/2015 | Tsai et al. |
| 2018/0108621 | A1 | 4/2018 | Burton et al. |
| 2018/0190424 | A1 | 7/2018 | Caffee et al. |

FOREIGN PATENT DOCUMENTS

| | | |
|---|---|---|
| CN | 107112110 A | 8/2017 |
| TW | 201725684 A | 7/2017 |

OTHER PUBLICATIONS

Hooman Darabi et al., "A Dual-Mode 802.11b/Bluetooth Radio in 0.35-μm CMOS", IEEE Journal of Solid-State Circuits, vol. 40, No. 3, Mar. 2005.

Ahmad Mirzaei et al., "Pulling Mitigation in Wireless Transmitters", IEEE Journal of Solid-State Circuits, vol. 49, No. 9, Sep. 2014.

Yue Wu et al., "Suppression of VCO Pulling Effects Using Even-Harmonic Quiet Transmitting Circuits", IEEE, 2015.

Ali Hajimiri et al., "A General Theory of Phase Noise in Electrical Oscillators", IEEE Journal of Solid-State Circuits, vol. 33, No. 2, Feb. 1998.

* cited by examiner

INDUCTOR DEVICE AND CONTROL METHOD THEREOF

RELATED APPLICATIONS

The present application is a Divisional Application of the U.S. application Ser. No. 16/704,030, filed Dec. 5, 2019, which claims priority to Taiwan Application Serial Number 107146550, filed Dec. 21, 2018, all of which are herein incorporated by reference in their entireties.

BACKGROUND

Field of Invention

The present disclosure relates to an electronic device and a method. More particularly, the present disclosure relates to an inductor device and a control method thereof.

Description of Related Art

In a direct-up transmitter, if the frequency of the voltage controlled oscillator (VCO) is selected as the same frequency as the even harmonics of the power amplifier (PA), the voltage controlled oscillator is possibly pulled by the power amplifier. As a result, the communication quality becomes deteriorated.

The situations in which the voltage controlled oscillator is affected by the power amplifier are classified into: "coupling between the inductor of the power amplifier and the inductor of the voltage controlled oscillator" and "coupling between the power line of the power amplifier and the power line of the voltage controlled oscillator". If the above problem is intended to be resolved, the frequency of the voltage controlled oscillator can be configured at non-integer multiple of the harmonic frequencies of the power amplifier. However, this configuration needs additional elements/components. Not only the space of the overall device is occupied, but some other interferences are also likely to be caused. In addition to that, if an algorithm is used to perform calibration, the algorithm is difficult to implement because there are numerous paths in which the voltage controlled oscillator may be affected by the power amplifier.

For the foregoing reasons, there is a need to solve the above-mentioned problems by providing an inductor device and a control method thereof.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

One objective of the present disclosure is to provide an inductor device and a control method thereof so as to resolve the problems of the prior art. The means of solution are described as follows.

One aspect of the present disclosure is to provide an inductor device. The inductor device comprises an 8-shaped inductor and a ring-type wire. The ring-type wire is disposed around an outer side of the 8-shaped inductor. The 8-shaped inductor comprises an input terminal and a center-tapped terminal. The input terminal of the 8-shaped inductor is located on a first side of the inductor device. The center-tapped terminal is located on a second side of the inductor device. The ring-type wire comprises an input terminal and a ground terminal. The input terminal of the ring-type wire is located on the first side of the inductor device. The ground terminal is located on the second side of the inductor device. The input terminal of the ring-type wire is coupled to the input terminal of the 8-shaped inductor.

Another aspect of the present disclosure is to provide control method of an inductor. The inductor device comprises an 8-shaped inductor and a ring-type wire. The ring-type wire is disposed around an outer side of the 8-shaped inductor. Both an input terminal of the 8-shaped inductor and an input terminal of the ring-type wire are located on a first side of the inductor device, and both a center-tapped terminal of the 8-shaped inductor and a ground terminal of the ring-type wire are located on a second side of the inductor device. The control method comprises: an interference signal forming currents respectively in the 8-shaped inductor and the ring-type wire when the interference signal is fed from the center-tapped terminal, wherein the current in the 8-shaped inductor has an opposite direction to the current in the ring-type wire.

Therefore, based on the technical content of the present disclosure, the inductor device and the control method thereof according to the embodiments of the present disclosure can change the inductor structure in a limited space. As a result, the coupling between the voltage controlled oscillator and the power amplifier can be effectively reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

Figure 1:
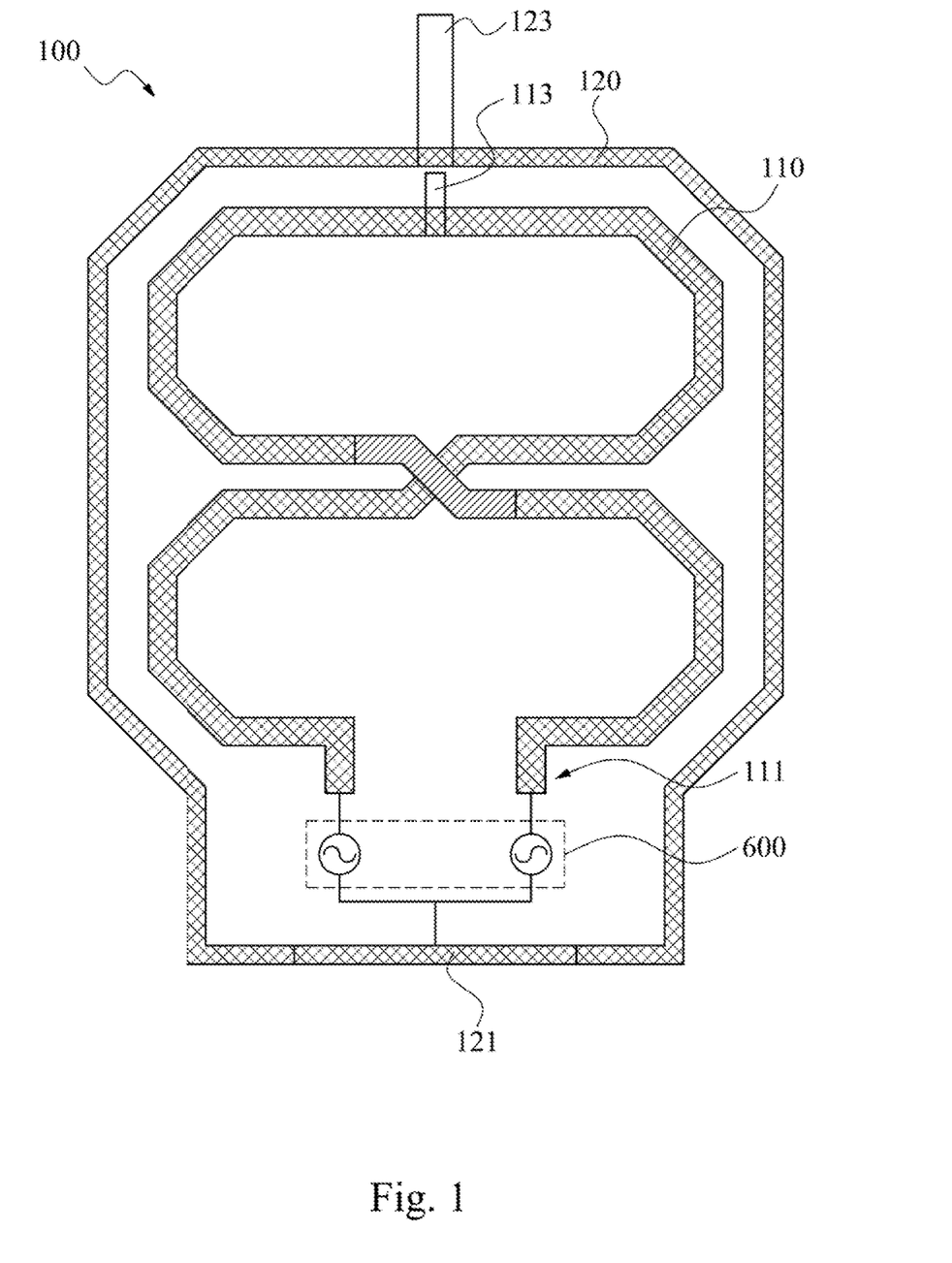
FIG. 1 depicts a schematic diagram of an inductor device according to one embodiment of the present disclosure.

FIG. 1 depicts a schematic diagram of an inductor device 100 according to one embodiment of the present disclosure. As shown in the figure, the inductor device 100 includes an 8-shaped inductor 110 and a ring-type wire 120. In addition, the 8-shaped inductor 110 includes an input terminal 111 and a center-tapped terminal 113. The ring-type wire 120 includes an input terminal 121 and a ground terminal 123. A crossing in a middle of the 8-shaped inductor 110 can be implemented by using a bridging structure. However, the present disclosure is not limited in this regard.

As for the structure, the ring-type wire 120 is disposed around an outer side of the 8-shaped inductor 110. However, the present disclosure is not limited to the shape of the ring-type wire 120 depicted in FIG. 1, which is only used to depict one of the implementation methods by taking an example. In other implementation methods, the shape of the ring-type wire 120 may be disposed closely adjacent to the 8-shaped inductor 110 so as to present a shape similar to a gourd. Or, the ring-type wire 120 may be disposed in any other suitable shape depending on practical needs. It is noted that the 8-shaped inductor 110 and the ring-type wire 120 may be disposed on a same metal layer. However, the 8-shaped inductor 110 and the ring-type wire 120 may be disposed on different metal layers depending on needs.

With additional reference to FIG. 1, both the center-tapped terminal 113 of the 8-shaped inductor 110 and the ground terminal 123 of the ring-type wire 120 are located on one side (such as an upper side of the figure) of the inductor device 100. In addition, both the input terminal 111 of the 8-shaped inductor 110 and the input terminal 121 of the ring-type wire 120 are located on another side (such as a lower side of the figure) of the inductor device 100.

Figure 2:
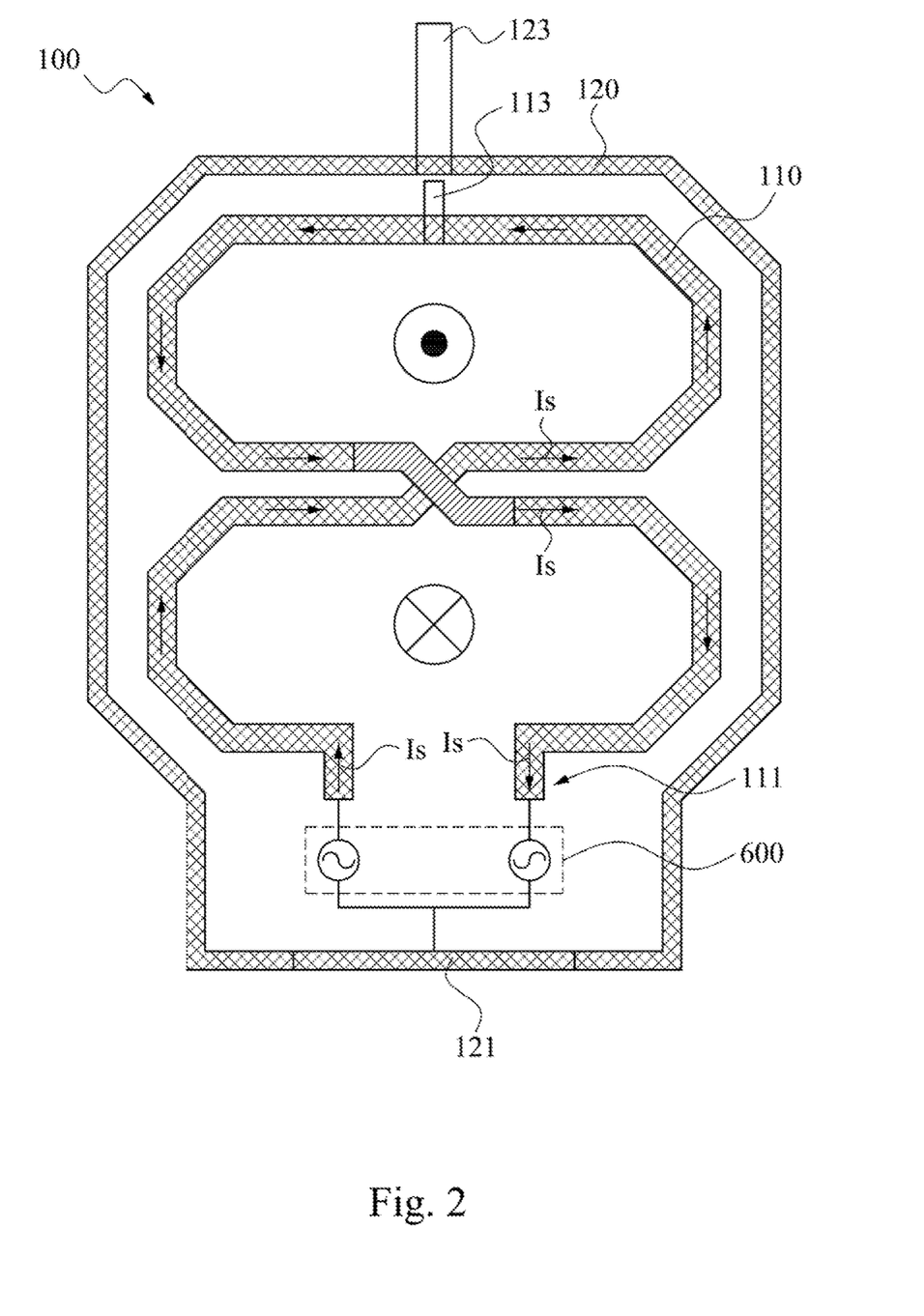
FIG. 2 depicts a schematic diagram of operations of an inductor device according to one embodiment of the present disclosure.

In one embodiment, the input terminal 121 of the ring-type wire 120 is coupled to the input terminal 111 of the 8-shaped inductor 110. For example, a description is provided with reference to FIG. 2. FIG. 2 depicts a schematic diagram of operations of the inductor device 100 according to one embodiment of the present disclosure, which is used to illustrate a differential mode signal of the inductor device 100. By using an operating current (not shown in the figure) to control a voltage controlled oscillator 600, an oscillating signal generated by the voltage controlled oscillator 600 is fed from the input terminal 111 of the 8-shaped inductor 110, and a surrounding current Is is formed in the 8-shaped inductor 110. The oscillating signal is a full wave rectified signal. FIG. 2 shows a direction of the oscillating signal of the surrounding current Is during an upper half period.

With additional reference to FIG. 2, since a current flowing into a node of the input terminal 111 is equal to a current flowing out of the node of the input terminal 111, the above surrounding current Is only flows around the 8-shaped inductor 110 and does not flow in the ring-type wire 120. Based on the flowing direction of the surrounding current Is, a magnetic field directed out a drawing plane is formed at an upper portion of the 8-shaped inductor 110 and a magnetic field directed into the drawing plane is formed at a lower portion of the 8-shaped inductor 110, and the magnetic fields of the two were canceled each other. As a result, there is no induced eddy current formed in the ring-type wire 120, so that the quality factor (Q) of the 8-shaped inductor 110 itself is not lowered. In other embodiments, the input terminal 111 of the 8-shaped inductor 110 includes a first terminal and a second terminal. The surrounding current Is may be fed from the first terminal on a left side of the figure, and flows around the 8-shaped inductor 110, and then flows out from the second terminal on a right side of the figure.

In one embodiment, a distance between the 8-shaped inductor 110 and the ring-type wire 120 is less than about 1 to 5 times a line width of the 8-shaped inductor 110. However, the present disclosure is not limited in this regard, and the above distance may be configured to be an appropriate multiple of the line witch of the inductor depending on practical needs.

Figure 3:
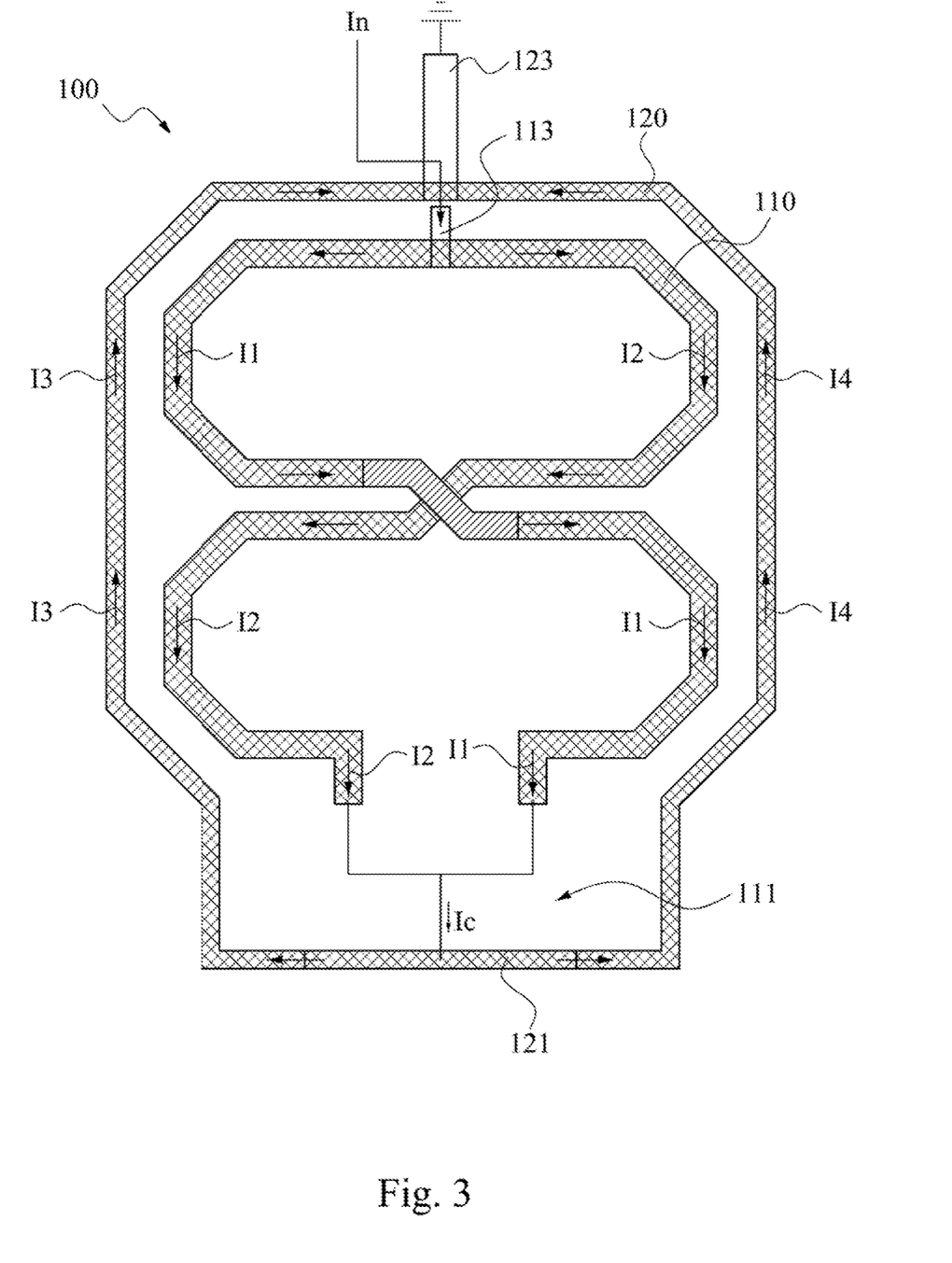
FIG. 3 depicts a schematic diagram of operations of an inductor device according to another embodiment of the present disclosure.

In other embodiments, the input terminal 121 of the ring-type wire 120 is coupled to the input terminal 111 of the 8-shaped inductor 110. For example, a description is provided with reference to FIG. 3. FIG. 3 depicts a schematic diagram of operations of the inductor device 100 according to another embodiment of the present disclosure, which is used to illustrate a common mode signal of the inductor device 100. The input terminal 121 of the ring-type wire 120 is coupled to the input terminal 111 of the 8-shaped inductor 110. At this time, when an interference signal In is fed from the center-tapped terminal 113, the interference signal In forms currents respectively in the 8-shaped inductor 110 and the ring-type wire 120. The interference signal In may enter the 8-shaped inductor 110 by coupling from a power amplifier (not shown in the figure). As shown in FIG. 3, the current of the interference signal In in the 8-shaped inductor 110 has an opposite direction to the current of the interference signal In in the ring-type wire 120. In one embodiment, the above interference signal In includes a noise current (Inoise), but the present disclosure is not limited in this regard.

With additional reference to FIG. 3, the interference signal In forms a first current I1 and a second current I2 on two opposite sides of the 8-shaped inductor 110. As shown in the figure, both the first current I1 and the second current I2 flow from a second side (such as an upper side of the figure) to a first side (such as a lower side of the figure) of the inductor device 100. The first current I1 and the second current I2 converge into a convergent current Ic at the input terminal 111 of the 8-shaped inductor 110. After that, the convergent current Ic is fed from the input terminal 121 of the ring-type wire 120, and forms a third current I3 and a fourth current I4 on two opposite sides of the ring-type wire 120, and both the third current I3 and the fourth current I4 flow from the first side (such as the lower side of the figure) to the ground terminal 123 located on the second side (such as the upper side of the figure) of the inductor device 100. It is thus understood that the currents I1, I2 in the 8-shaped inductor 110 flow from the second side to the first side of the inductor device 100, and the currents I3, I4 in the ring-type wire 120 flow from the second side to the first side of the inductor device 100. As a result, the currents in the 8-shaped inductor 110 have an opposite direction to the currents in the ring-type wire 120 so that magnetic fields induced by the currents of the 8-shaped inductor 110 and magnetic fields induced by the currents of the ring-type wire 120 were canceled each other.

Figure 4:
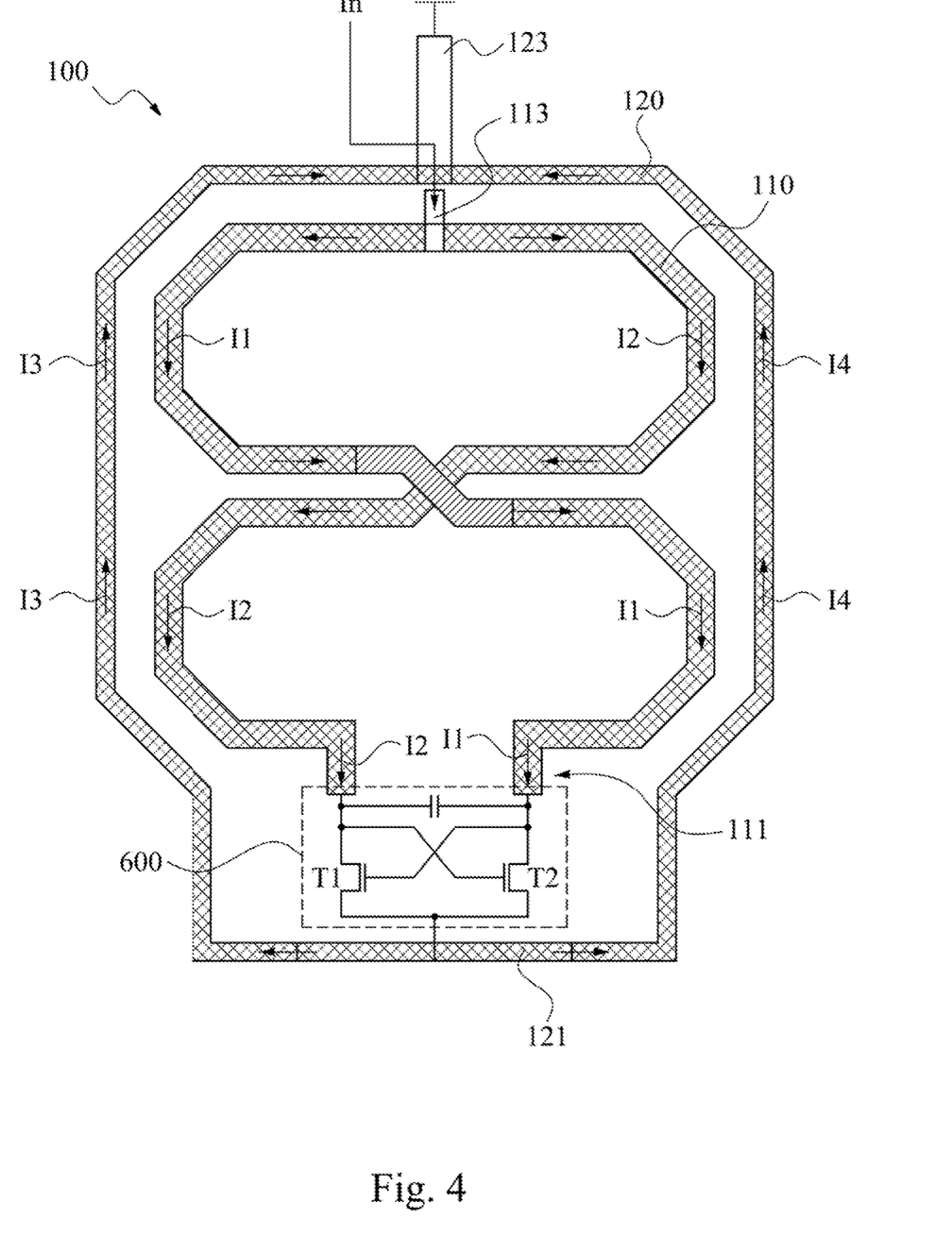
FIG. 4 depicts a schematic diagram of operations of an inductor device according to still another embodiment.

FIG. 4 depicts a schematic diagram of operations of the inductor device 100 according to still another embodiment. As shown in the figure, the present disclosure adopts the 8-shaped inductor 110. Since the 8-shaped inductor 110 has the characteristic of cancelling out the magnetic fields, isolation between the power amplifier (not shown in the figure) and the voltage controlled oscillator 600 can be additionally improved as compared with a symmetrical inductor. Coupling of a power line of the power amplifier to a power line of the voltage controlled oscillator 600 is a common mode signal for the voltage controlled oscillator 600. A signal of the power amplifier is a signal carrying modulation data. Therefore, if the voltage controlled oscillator 600 operates at frequencies of even harmonics of the power amplifier, a modulation signal is a common mode interference signal In for the voltage controlled oscillator 600.

With additional reference to FIG. 4, the voltage controlled oscillator 600 includes cross-coupled transistors T1, T2 and a capacitor according to the present embodiment. The transistors T1, T2 may be N-type metal oxide semiconductor field effect transistors (NMOS FETs), P-type metal oxide semiconductor field effect transistors (PMOS FETs), or complementary metal oxide semiconductor field effect transistors (CMOS FETs). However, the present disclosure is not limited in this regard. In one embodiment, the transistor T1 includes a first terminal, a first control terminal, and a second terminal. The first terminal of the transistor T1 is coupled to the input terminal 111 of the 8-shaped inductor 110, the second terminal of the transistor T1 is coupled to the input terminal 121 of the ring-type wire 120. The transistor T2 includes a third terminal, a second control terminal, and a fourth terminal. The third terminal of the transistor T2 is coupled to the input terminal 111 of the 8-shaped inductor 110 and the first control terminal of the transistor T1, the second control terminal of the transistor T2 is coupled to the first terminal of the transistor T1, and the fourth terminal of the transistor T2 is coupled to the input terminal 121 of the ring-type wire 120. The capacitor is coupled between the first terminal of the transistor T1 and the third terminal of the transistor T2.

When the transistors T1, T2 are simultaneously turned on and a waveform of the voltage controlled oscillator 600 passes a zero-crossing point, it is the time when the voltage controlled oscillator 600 is most susceptible to noise interference. The present disclosure adopts the single-turn 8-shaped inductor 110, and the single-turn 8-shaped inductor 110 is surrounded by the ring-type wire 120 that is a flow path of the common mode signal. As a result, a common mode inductance value can be effectively reduced to L(1-m), and m is a coupling coefficient of the inductor. When the waveform of the voltage controlled oscillator 600 is close to the zero-crossing point, it is also the state that the voltage controlled oscillator 600 is most easily interfered with by the common mode signal. At this time, the transistors T1, T2 are simultaneously turned on, and the common mode interference signal In is equally divided into two paths and flows back to the ground terminal 123. In this manner, the common mode inductance value can be reduced to L(1-m) such that the degree to which the voltage controlled oscillator 600 is subjected to the pulling of the power amplifier is improved.

Figure 5:
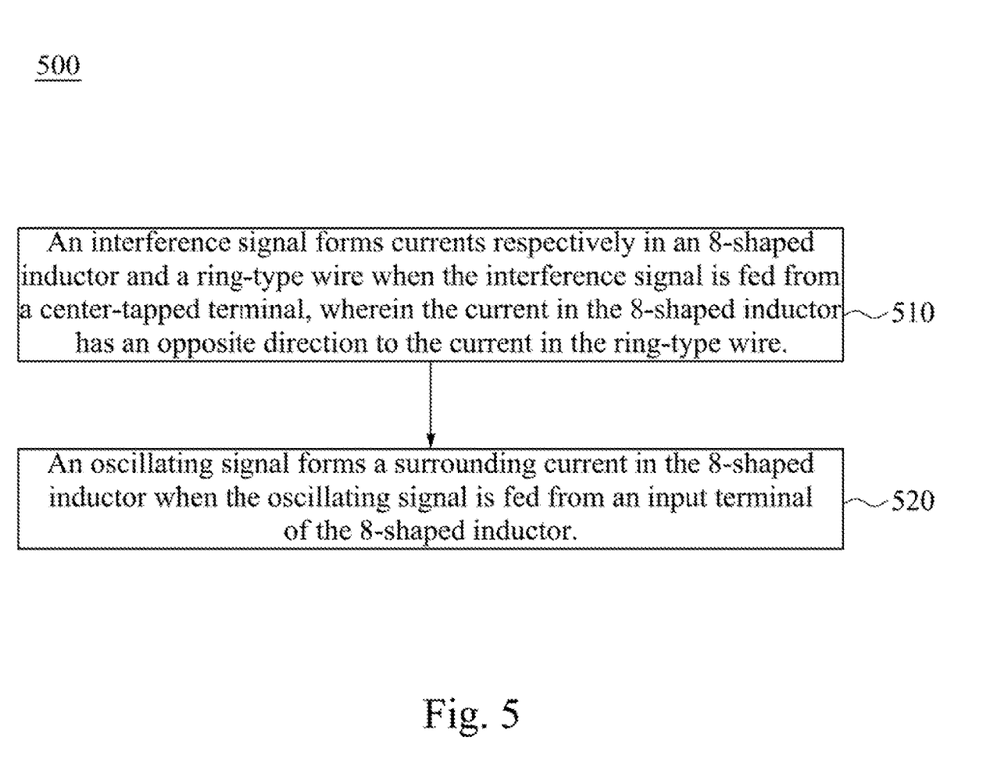
FIG. 5 depicts a schematic diagram of a flow of a control method of an inductor device according to one embodiment of the present disclosure.

FIG. 5 depicts a schematic diagram of a flow of a control method 500 of an inductor device according to one embodiment of the present disclosure. As shown in the figure, the control method 500 of the inductor device includes the steps as follows.

Step 510: An interference signal forms currents respectively in an 8-shaped inductor and a ring-type wire when the interference signal is fed from a center-tapped terminal, wherein the current in the 8-shaped inductor has an opposite direction to the current in the ring-type wire.

Step 520: An oscillating signal forms a surrounding current in the 8-shaped inductor when the oscillating signal is fed from an input terminal of the 8-shaped inductor.

In order to facilitate understanding of the control method 500 of the inductor device, a description is provided with reference to FIG. 2, FIG. 3, and FIG. 5. In step 510, when the interference signal In is fed from the center-tapped terminal 113, the interference signal In forms the currents respectively in the 8-shaped inductor 110 and the ring-type wire 120, and the current in the 8-shaped inductor 110 has an opposite direction to the current in the ring-type wire 120. In one embodiment, the above interference signal In includes the noise current (Inoise), but the present disclosure is not limited in this regard.

In step 520, the oscillating signal forms the surrounding current Is in the 8-shaped inductor 110 when the oscillating signal of the voltage controlled oscillator 600 is fed from the input terminal 111 of the 8-shaped inductor 110.

In one embodiment, the step of forming the currents respectively in the 8-shaped inductor 110 and the ring-type wire 120 based on the interference signal In includes: forming the first current I1 and the second current I2 on two opposite sides of the 8-shaped inductor 110 based on the interference signal In, in which both the first current I1 and the second current I2 flow from a second side to a first side of the inductor device 100; and the first current I1 and the second current I2 converge into the convergent current Ic at the input terminal 111 of the 8-shaped inductor 110.

In one embodiment, the step of forming the currents respectively in the 8-shaped inductor 110 and the ring-type wire 120 based on the interference signal In includes: forming the third current I3 and the fourth current I4 on two opposite sides of the ring-type wire 120 based on the convergent current Ic, in which both the third current I3 and the fourth current I4 flow from the first side to the second side of the inductor device 100.

In one embodiment, the surrounding current Is only flows around the 8-shaped inductor 110. In another embodiment, the input terminal 111 of the 8-shaped inductor 110 includes a first terminal and a second terminal. The surrounding current Is is fed from the first terminal and flows around the 8-shaped inductor 110, and flows out from the second terminal. In other embodiments, the above interference signal In is a common mode signal. The oscillating signal is a differential mode signal.

Figure 6:
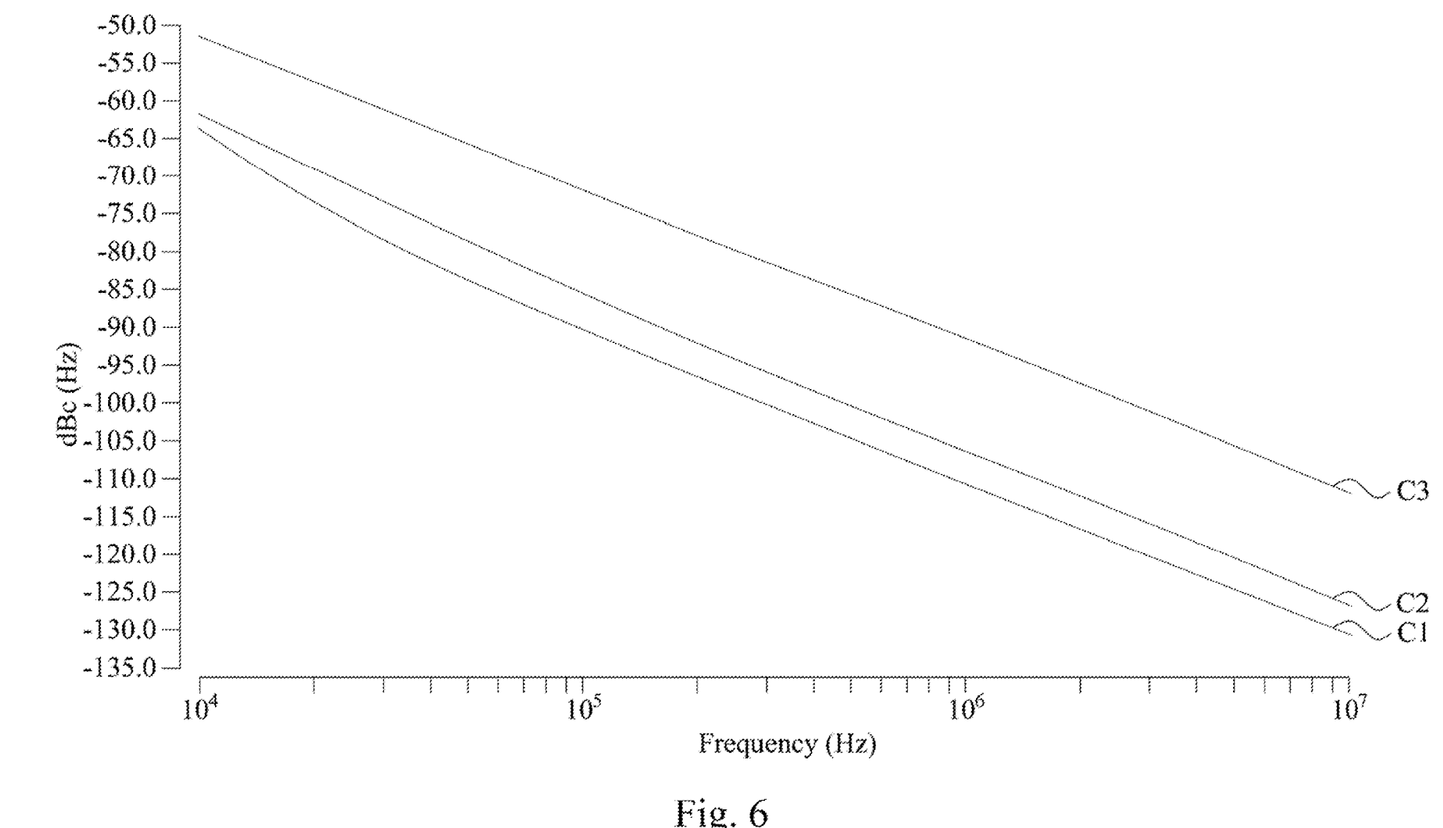
FIG. 6 depicts a schematic diagram of experimental data of an inductor device according to one embodiment of the present disclosure.

FIG. 6 depicts a schematic diagram of experimental data of the inductor device 100 according to one embodiment of the present disclosure. As shown in the figure, when the voltage controlled oscillator 600 is not interfered, the experimental curve is C1. Take the frequency of 100.0 kHz as an example, the phase noise is −90.39 dBc/Hz. When a high frequency noise is fed into the inductor device 100 that does not have the ring-type wire 120 of the present disclosure, the experimental curve is C3. Similarly, take the frequency of 100.0 kHz as an example, the phase noise is increased to −71.3 dBc/Hz. However, once the inductor device 100 that has the ring-type wire 120 of the present disclosure is used, the experimental curve is C2. Similarly, take the frequency of 100.0 kHz as an example, the phase noise is reduced to −86.07 dBc/Hz. It is thus understood that using the inductor device 100 that has the ring-type wire 120 of the present disclosure actually can effectively reduce the interference with the voltage controlled oscillator 600.

It can be understood from the embodiments of the present disclosure that application of the present disclosure has the following advantages. The inductor device and the control method thereof according to the embodiments of the present disclosure can change the inductor structure in a limited space. As a result, the coupling between the voltage controlled oscillator and the power amplifier can be effectively reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A control method of an inductor device, wherein the inductor device comprises an 8-shaped inductor and a ring-type wire, the ring-type wire is disposed around an outer side of the 8-shaped inductor, wherein both an input terminal of the 8-shaped inductor and an input terminal of the ring-type wire are located on a first side of the inductor device, and both a center-tapped terminal of the 8-shaped inductor and a ground terminal of the ring-type wire are located on a second side of the inductor device, wherein the control method comprises:

an interference signal forming currents respectively in the 8-shaped inductor and the ring-type wire when the interference signal is fed from the center-tapped terminal, wherein the current in the 8-shaped inductor has an opposite direction to the current in the ring-type wire.

2. The control method of claim 1, further comprising:

an oscillating signal forming a surrounding current in the 8-shaped inductor when the oscillating signal is fed from the input terminal of the 8-shaped inductor.

3. The control method of claim 2, wherein the step of forming the currents respectively in the 8-shaped inductor and the ring-type wire by the interference signal comprises:

forming a first current and a second current on two opposite sides of the 8-shaped inductor based on the interference signal, wherein both the first current and the second current flow from the second side to the first side of the inductor device; and the first current and the second current converging into a convergent current at the input terminal of the 8-shaped inductor.

4. The control method of claim 3, wherein the step of forming the currents respectively in the 8-shaped inductor and the ring-type wire by the interference signal further comprises:

forming a third current and a fourth current on two opposite sides of the ring-type wire based on the convergent current, wherein both the third current and the fourth current flow from the first side to the second side of the inductor device.

5. The control method of claim 4, wherein the surrounding current only flows around the 8-shaped inductor.

6. The control method of claim 5, wherein the input terminal of the 8-shaped inductor comprises a first terminal and a second terminal, wherein the surrounding current is fed from the first terminal and flows around the 8-shaped inductor, and flows out from the second terminal.

7. The control method of claim 2, wherein the interference signal is a common mode signal, and the oscillating signal is a differential mode signal.

8. The control method of claim 1, wherein a distance between the 8-shaped inductor and the ring-type wire is less than 1 to 5 times a line width of the 8-shaped inductor.

9. The control method of claim 1, wherein the input terminal of the ring-type wire is coupled to the input terminal of the 8-shaped inductor through an oscillator.

10. The control method of claim 9, wherein the oscillator comprises:

a first transistor comprising a first terminal, a first control terminal, and a second terminal, wherein the first terminal is coupled to the input terminal of the 8-shaped inductor, and the second terminal is coupled to the input terminal of the ring-type wire;

a second transistor comprising a third terminal, a second control terminal, and a fourth terminal, wherein the third terminal is coupled to the input terminal of the 8-shaped inductor and the first control terminal, the second control terminal is coupled to the first terminal, and the fourth terminal is coupled to the input terminal of the ring-type wire; and a capacitor coupled between the first terminal of the first transistor and the third terminal of the second transistor.

* * * * *